Figure 1:
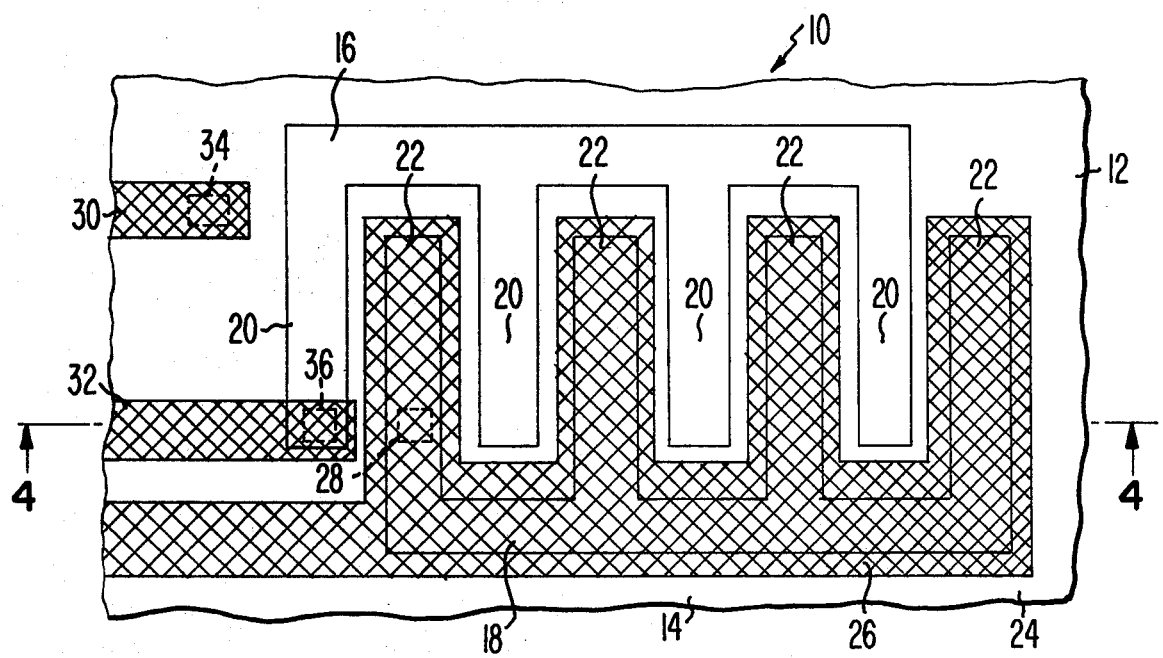

United States Patent [19]

Polinsky

[11] 4,096,512
[45] Jun. 20, 1978

[54] MONOLITHIC LIGHT DETECTOR

[75] Inventor: Murray Arthur Polinsky, Somerville, N.J.

[73] Assignee: RCA Corp., New York, N.Y.

[21] Appl. No.: 775,896

[22] Filed: Mar. 9, 1977

[51] Int. Cl.² .............................................. H01L 27/14
[52] U.S. Cl. ..................................... 357/30; 250/211 J
[58] Field of Search ....................... 357/30, 32, 33, 24; 250/211 J

[56] References Cited

U.S. PATENT DOCUMENTS

| 3,806,729 | 4/1974 | Caywood ........................... 357/24 X |
| 3,969,751 | 7/1976 | Drukaroff et al. ................. 357/32 X |
| 3,978,343 | 8/1976 | Broderick et al. ..................... 357/19 |

*Primary Examiner*—Stanley D. Miller, Jr.
*Assistant Examiner*—James W. Davie
*Attorney, Agent, or Firm*—H. Christoffersen; Sanford J. Asman

[57] ABSTRACT

A highly sensitive light detector is described which employs two interdigitated PN junction light detectors, one of which is covered by an opaque material. The one covered by opaque material is used as a standard for eliminating dark current efffects.

10 Claims, 4 Drawing Figures

U.S. Patent        June 20, 1978        4,096,512

MONOLITHIC LIGHT DETECTOR

The present invention relates to semiconductor light detectors.

One method of measuring light levels involving the use of semiconductor devices is accomplished by reverse biasing a PN junction and measuring the leakage current when the junction is not exposed to light and then measuring the leakage current when the junction is exposed to light. In general, the leakage current increases with increased illumination due to the formation of hole-electron pairs which are induced by the illumination. However, a problem which arises when using a light detector employing a PN junction is that the leakage current of a PN junction which is not illuminated is significant when compared to the leakage current when the junction is illuminated. In other words, the value of the "dark current", i.e. the leakage current when the PN junction is not illuminated, cannot be disregarded. As a result, PN junction semiconductor light detectors previously known are not highly sensitive when used to measure low levels of light illumination. In addition, because dark current increases rapidly with increasing temperature, conventional diodes exhibit much reduced sensitivity at high operating temperatures.

In order to eliminate insensitivity due to high "dark current", the present invention utilizes two interdigitated relatively large area PN junctions, one of which is covered by an opaque material. The result is that the two PN junctions will have closely matched dark currents one of which can be used as a reference for determining the current due exclusively to illumination on the other.

While it is well known that light sensitive diodes are photovoltaic and can be used to generate a voltage which is measured by a high impedance circuit, in the present invention the light sensitive diodes are used with a low impedance voltage supply and their reverse current is measured.

In the Drawings

Figure 2:
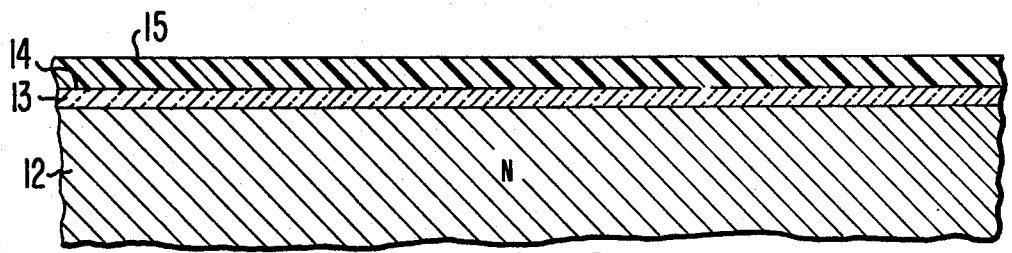
Figure 3:
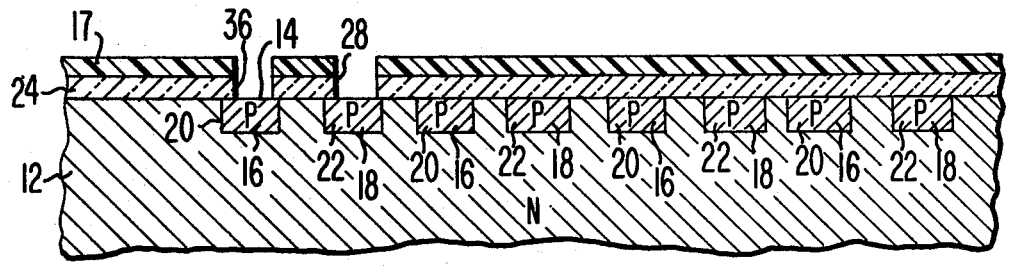
Figure 4:
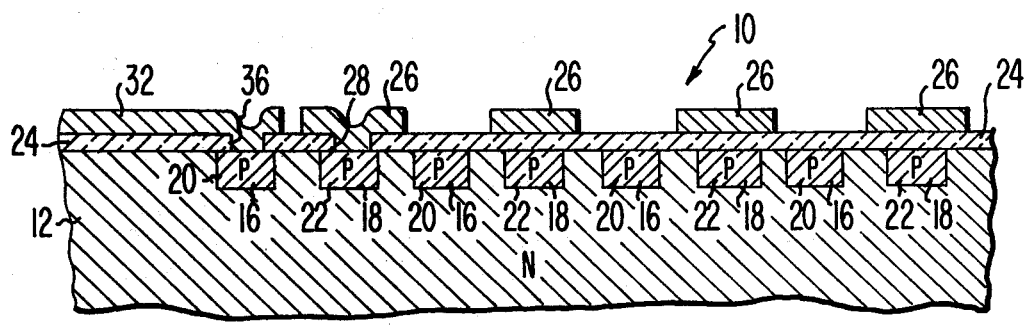

FIG. 1 is a top view of the device of the present invention in which opaque areas are shown cross hatched in order to show underlying areas; and FIGS. 2-4 are cross-sectional views of the device of FIG. 1 taken along the lines 4—4 of FIG. 1.

Referring generally to FIG. 1, a light detector 10 embodying the present invention is shown. The light detector 10 comprises a substrate of semiconductor material 12, which in the preferred embodiment is an N type body of silicon, having a surface 14. Formed on the surface 14 of the substrate 12 are a pair of interdigitated P type regions 16, 18. The region 16 has a plurality of fingers 20 and the region 18 has a plurality of fingers 22. The fingers 20, 22 are positioned in an interlocking arrangement whereby each finger 20 is separated from other fingers 20 by a finger 22, and each finger 22 is separated from other fingers 22 by a finger 20.

Overlying one of the regions 18 is a layer of opaque material 26, shown by cross hatching in FIG. 1 in order to show the underlying region 18. In the preferred embodiment of the invention, the opaque layer 26 is a layer of aluminum. The use of aluminum as the opaque layer 26 is beneficial in that aluminum is used for metallizing the device 10 to make electric contacts. Thus, in one step the opaque layer 26 and metal contacts are simultaneously formed.

An oxide layer 24, not visible in FIG. 1 overlies the regions 16, 18 except where ohmic contacts are made to the substrate 12 and to the regions 16, 18 through bond pad openings 34, 36 and 28, respectively.

The aluminum layer 26 which is used to shield the PN junction formed between the P type region 18 and the N type body 12 is also used as an electrical contact to the region 18 through the bond pad opening 28 which extends through the oxide layer 24. Other aluminum conductors 30, 32 are used to contact the substrate 12 and the P type region 16, respectively, through bond pad openings 34, 36 respectively.

In using the device 10 of the present invention electrodes are connected to the conductors 30, 32 and 26, voltages are imposed on the electrodes and the leakage currents of the PN junctions are measured, such that the leakage current of the PN device formed by regions 16 and substrate 12 is measured between conductors 30 and 32 and the leakage current of the PN junction devices formed by the substrate 12 and the region 18 is measured between conductors 30 and 26. In view of the fact that the regions 16 and 18 each have the same size and shape, are interdigitated, and are in close proximity on a single substrate insuring that their temperatures are very closely matched, their leakage currents will be essentially equal. As a result of the opaque layer 26 over the region 18, the leakage current measured between the conductors 26 and 30 is representative of the "dark current" for the device formed by the region 16 and the substrate 12 as well as for the device formed by the region 18 and the substrate 12. Accordingly, the leakage current of the device formed by the region 18 and the substrate 12 can be subtracted by an external circuit from the leakage current of the device formed by the region 16 in the substrate 12 for any level of illumination thereby providing a difference value of leakage current from the device formed by the region 16 on substrate 12 which is representative of the level of illumination present on the surface of the device 10.

In order to form a device in accordance with the present invention one starts with a body of semiconductor material 12, preferably N type silicon as shown in FIG. 2. On the surface 14 of the body 12 an oxide layer 13 is formed in any generally known manner, such as by thermal oxidation or by deposition of silicon dioxide by the decomposition of silane. Next, a layer of photoresist 15 is applied to the surface of the P type layer 13, and a photomask (not shown) is used to define the regions 16, 18 on the photoresist layer which is then developed. An etchant, such as buffered hydrofluoric acid, is used to remove the exposed portions of the oxide layer 13 thereby exposing portions of the surface 14 into which acceptor impurities, such as boron are diffused to a depth of about 3000A to form the regions 16, 18. In the preferred embodiment of the invention the regions 16, 18 are formed by ion implanting boron at 80 KeV for a dose of $10^{13}$ atoms/cm$^2$. Then the substrate is heated to about 1000° C for 15 minutes in a non-oxidizing atmosphere to activate the implant.

Then, an oxide layer 24 is formed over the exposed portions of the surface 14 of the substrate 12 as well as over the diffused P type regions 16, 18. The oxide layer 24 may be formed either by the deposition of silicon dioxide, which may be accomplished by the thermal deposition of silane or, alternatively, the oxide layer 24 may be formed by placing a substrate 12 into a furnace in the presence of oxygen and a small quantity of water vapor and HCl to grow an oxide to have a thickness of between 500A and 12,000A as will be more fully explained hereinafter.

Next, a second layer of photoresist 17 is applied over the surface of the oxide layer 24 and the bond pad openings 28, 34, 36 are defined, then the photoresist layer 17 is developed. The exposed portions of the oxide layer 24 are removed by etching in order to expose the surface 14 of the substrate 12 over portions of the regions 16 and 18 as shown in FIG. 3. The remaining photoresist is then stripped and an aluminum layer is applied over the surface of the oxide layer 24. The application of the aluminum layer may be accomplished by any generally known manner. Then, using a third photoresist layer and mask the aluminum is defined and etched to form the opaque, conductive layer 26 and the other conductors 30, 32 as shown in FIG. 4. By using aluminum for the opaque layer 26, it can simultaneously serve as the electrical contact to the region 18.

The thickness of the oxide layer 24 is generally selected to be between about 500 and 12,000A. The color of a silicon dioxide layer is determined by its thickness. In view of the fact that light detectors are used in applications, such as photography, in which their sensitivity to various portions of the visible spectrum is important, the thickness of the layer 24 is subject to change based upon the application to which the light detector is to be subjected.

An advantage of the present invention is that it provides a highly sensitive semiconductor light detector which is manufactured in a planar geometry suitable for integration in monolithic planar integrated circuits. Thus, the light detector could be formed on the same substrate as the circuitry required to subtract the leakage current from the dark diode formed by the substrate and the region 18.

What is claimed is:

1. A monolithic light detector comprising:
   (a) a substrate of semiconductor material predominantly of one conductivity type, said substrate having a surface;
   (b) a pair of identically shaped regions having a conductivity type opposite that of said substrate which extend into said surface of said substrate and form PN junctions with said substrate, each of said regions comprising a plurality of fingers, the fingers of one of said regions being interdigitated with the fingers of the other of said regions;
   (c) an opaque covering extending over one of said regions and its associated PN junction; and
   (d) means for making electrical contact to said substrate and to each of said regions.

2. The monolithic light detector of claim 1 wherein said substrate is comprised of N type silicon and said regions are P type silicon.

3. The monolithic light detector of claim 1 wherein said means for making electrical contact comprise metal conductors which make ohmic contact to the substrate and to each of the regions.

4. The monolithic light detector of claim 3 wherein said opaque covering is comprised of one of said metal conductors.

5. The monolithic light detector of claim 4 wherein said conductors are comprised of aluminum.

6. The monolithic light detector of claim 1 further comprising an insulating layer overlying the pair of regions.

7. The monolithic light detector of claim 6 wherein said insulating layer has a color associated with its thickness.

8. The monolithic light detector of claim 7 wherein the thickness of said insulating layer is selected to alter the sensitivity of the light detector to particular frequencies of light.

9. The monolithic light detector of claim 8 wherein said substrate is comprised of silicon and said insulator is comprised of silicon dioxide.

10. The monolithic light detector of claim 9 wherein said insulator is between 500A thick and 12,000A thick.

* * * * *